(12) United States Patent
Salameh

(10) Patent No.: US 9,780,728 B1
(45) Date of Patent: Oct. 3, 2017

(54) DOUBLE BALANCED MIXER

(71) Applicant: Peregrine Semiconductor Corporation, San Diego, CA (US)

(72) Inventor: Daoud Salameh, Reading (GB)

(73) Assignee: Peregrine Semiconductor Corporation, San Diego, CA (US)

( * ) Notice: Subject to any disclaimer, the term of this patent is extended or adjusted under 35 U.S.C. 154(b) by 51 days.

(21) Appl. No.: 15/083,939

(22) Filed: Mar. 29, 2016

(51) Int. Cl.
*H03D 7/02* (2006.01)
*H03D 7/14* (2006.01)
*H03H 7/42* (2006.01)
*H01L 23/66* (2006.01)
*H01L 27/06* (2006.01)
*H01L 27/12* (2006.01)
*H01L 27/092* (2006.01)
*H01L 29/78* (2006.01)
*H01L 29/786* (2006.01)
*H01L 21/84* (2006.01)
*H01L 21/86* (2006.01)
*H01L 21/8238* (2006.01)

(52) U.S. Cl.
CPC ....... *H03D 7/1458* (2013.01); *H01L 21/8238* (2013.01); *H01L 21/84* (2013.01); *H01L 21/86* (2013.01); *H01L 23/66* (2013.01); *H01L 27/0629* (2013.01); *H01L 27/092* (2013.01); *H01L 27/1203* (2013.01); *H01L 29/786* (2013.01); *H01L 29/7838* (2013.01); *H03D 7/02* (2013.01); *H03D 7/1408* (2013.01); *H03D 7/1441* (2013.01); *H03H 7/42* (2013.01)

(58) Field of Classification Search
CPC .. H03D 7/1458; H03D 7/1441; H03D 7/1408; H03D 7/02; H01L 27/1203; H01L 23/66; H01L 27/0629; H01L 21/8238; H01L 29/7838; H01L 29/786; H01L 21/84; H01L 21/86; H01L 27/092; H03H 7/42
See application file for complete search history.

(56) References Cited

U.S. PATENT DOCUMENTS 5,175,885 A * 12/1992 Lange ................. H04B 1/26
333/26
8,131,248 B2 * 3/2012 Kumar ................. H03D 7/165
333/125

OTHER PUBLICATIONS

RF Technology & Design, "Double Balanced Mixer Tutorial", http://www.radio-electronics.com, Mar. 7, 2016, 7 pgs.

(Continued)

*Primary Examiner* — Jung Kim
(74) *Attorney, Agent, or Firm* — Jaquez Land Greenhaus LLP; Martin J. Jaquez, Esq.; John Land, Esq.

(57) ABSTRACT

A FET based double balanced mixer (DBM) that exhibits good conversion gain and IIP3 values and provides improved linearity and wide bandwidth. In one embodiment, a first balun is configured to receive a local oscillator (LO) signal and generate two balanced LO signals that are coupled to two corresponding opposing nodes of a four-node FET ring. A second balun is configured to pass an RF signal on the unbalanced side. The FET ring includes at least four FETs connected as branches of a ring, with the source of each FET connected to the drain of a next FET in the ring. Each FET is preferably fabricated as, or configured as, a low threshold voltage device having its gate connected to its drain, which causes the FET to operate as a diode, but with the unique characteristic of having close to a zero turn-on voltage.

32 Claims, 5 Drawing Sheets

(56) References Cited

OTHER PUBLICATIONS

Komoni, et al., "Fundamental Performance Limits and Scaling of a CMOS Passive Double-Balanced Mixer" IEEE 2008, pp. 297-300.
Allen, P.E., "Lecture 140—The MOS Switch and MOS Diode", CMOS Analog Circuit Design, Mar. 25, 2010, 16 pgs.
Chen, Degang J., "Mixer Design", Feb. 24, 2005, 115 pgs.
Rosu, Julian, "RF Mixers", http://www.qsl.net/va3iul, May 21, 2014, 25 pgs.
Kalmeijer, Rob, "Taking the Mystery out of Diode Double-Balanced Mixers", http://www.robkalmeijer.nl/techniek/electronica/radiotechniek/hambladen, Mar. 7, 2016, 11 pgs.
Solfaghari, et al., "Stacked Inductors and Transformers in CMOS Technology", IEEE Journal of Solid-State Circuits, vol. 36, No. 4, Apr. 2001, pp. 620-628.

* cited by examiner

DOUBLE BALANCED MIXER

BACKGROUND (1) Technical Field

This invention relates to electronic circuitry, and more particularly to radio frequency circuits.

(2) Background

In electronics, a frequency mixer (or just "mixer") is an electrical circuit that creates new frequencies from two applied signals. More particularly, in their simplest form, mixers are 3-port active or passive devices designed to yield both a sum and a difference frequency at a single output port when two distinct input frequencies are inserted into the other two ports. Thus, when two signals at frequencies $f_1$ and $f_2$ are applied to a mixer, the intended output is a product signal of the sum $f_1+f_2$ and difference $f_1-f_2$ of the original frequencies. In addition, the inputs to a mixer may be complex waveforms, such as a signal spectrum (e.g., in CDMA cellular telephone systems) or a broad spectrum of signals (e.g., cable TV). In practice, mixers also produce harmonic frequencies and higher order sum and difference frequencies.

Mixers have a variety of uses, particularly in radio frequency (RF) electronic systems. For example, mixers are widely used to shift signals from one frequency range to another, a process known as heterodyning, for convenience in transmission or further signal processing. In addition, a mixer can be used as a phase detector, modulator, or demodulator, among other uses. In all cases, mixers exhibit a characteristic called linearity, which is a measure of how well the mixer converts its applied signals into the desired output while minimizing the amount of unwanted signals such as harmonics or higher order mixing products. Two well-known measures of linearity are the input-referenced second intercept point (IIP2) and the input-referenced third intercept point (IIP3). The harmonic frequencies and higher order sum and difference frequencies output by mixers are the principal reason that linearity is important in mixer design.

Mixers come in a variety of topologies for various applications. A particularly valuable topology is the double balanced mixer, used primarily to improve linearity beyond that of a single balanced mixer, especially for even-order mixing products. Typically, a double balanced mixer (DBM) has both its inputs applied to differential circuits, so that neither of the input signals and only the product signal appears at the output. The most common form of DBM is the diode DBM. In its simplest form, the diode DBM consists of two unbalanced-to-balanced transformers (also known as a "balun" transformer or simply "balun") and a diode ring consisting of four diodes. A mixer has three ports: an RF port, a local oscillator (LO) port, and an intermediate frequency (IF) port. The RF port is where a high frequency signal is applied for down-conversion or where a high-frequency signal is output for up-conversion. The LO port is where the RF signal for the mixer is injected. The IF port is where a down-converted RF signal is passed, or where a signal to be up-converted to an RF signal is applied.

FIG. 1 is a schematic diagram of a conventional diode double balanced mixer 100. A first balun 102 is configured to receive an LO signal on the unbalanced side and generate two balanced LO output signals that are coupled to two corresponding opposing nodes of a diode ring 104. The ring diode 104 often comprises Schottky diodes, but may comprise other switching elements such as conventional diodes or LO-gated FETs. A second balun 106 is configured to pass an RF signal at a corresponding port on the unbalanced side of the second balun 106. The two legs of the balanced side of the second balun 106 couple the RF signal to the remaining two opposing nodes of the diode ring 104. The IF signal port is coupled to the center tap of the second balun 106.

A problem with conventional diode DBMs is that their conversion gain (CG) rapidly decreases as LO power decreases, due to the turn-on voltage of the diodes. For example, a typical silicon diode has a 0.7V turn-on voltage. Conversion gain (or loss, when the gain is negative) is the ratio of the desired IF output (voltage or power) to the RF input signal value (voltage or power). A typical diode DBM has a CG of approximately −6 dB. The diode turn-on voltage also makes it impractical to use a diode ring with more than one diode per branch for linearity improvement, due to the large LO drive signal that would be required.

Another problem with conventional diode DBMs is that their third-order input-referenced intercept point (IIP3) value increases at a slow rate versus LO power. The IIP3 measure is the RF input power at which the output power levels of unwanted intermodulation products and a desired IF output would be equal, and is a widely used measure of linearity in RF systems.

Accordingly, there is a need for a double balanced mixer that exhibits good conversion gain and IIP3 values, and which provide improved linearity and wide bandwidth. The present invention meets these needs.

SUMMARY OF THE INVENTION

The present invention provides a field effect transistor (FET) based double balanced mixer (DBM) that exhibits good conversion gain and IIP3 values and provides improved linearity and wide bandwidth.

In one embodiment, a first balanced-unbalanced transformer (balun) is configured to receive a local oscillator (LO) signal on the unbalanced side and generate two balanced LO output signals that are coupled to two corresponding opposing nodes of a four-node FET ring. A second balun is configured to pass a radio frequency (RF) signal on the unbalanced side. The two legs of the balanced side of the second balun are coupled to the remaining two opposing nodes of the FET ring through DC-blocking capacitors which provide isolation between the RF and intermediate frequency (IF) signal ports. The IF signal port is coupled through quarter-wave isolating elements to both two legs of the balanced side of the second balun after the DC-blocking capacitors and before the FET ring. Taking the IF signal at those points has the advantage of improved balance because the first balun and the second balun can be essentially identical. Notably, no balun is required for the IF port, as is the case with some conventional DBM circuits.

The FET ring includes at least four FETs connected as branches of a ring, with the source of each FET connected to the drain of a next FET in the ring. The FETs are preferably fabricated as enhancement mode devices using NMOS or CMOS technology, but the circuit may be adapted to other FET modes and technologies. In addition, each FET is preferably fabricated as, or configured as, a low threshold voltage device. Each FET has its gate connected to its drain, which causes the FET to operate as a diode, but with the unique characteristic of having close to a zero turn-on voltage (i.e., the turn-on voltage is approximately equal to the threshold voltage of the FET). Using drain-gate connected FETs in a FET ring for a DBM reduces conversion gain (CG) variation versus LO power, and provides wideband linearity over a range of LO power levels.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

The present invention provides a field effect transistor (FET) based double balanced mixer (DBM) that exhibits good conversion gain and IIP3 values and provides improved linearity and wide bandwidth.

First Embodiment

Figure 1:
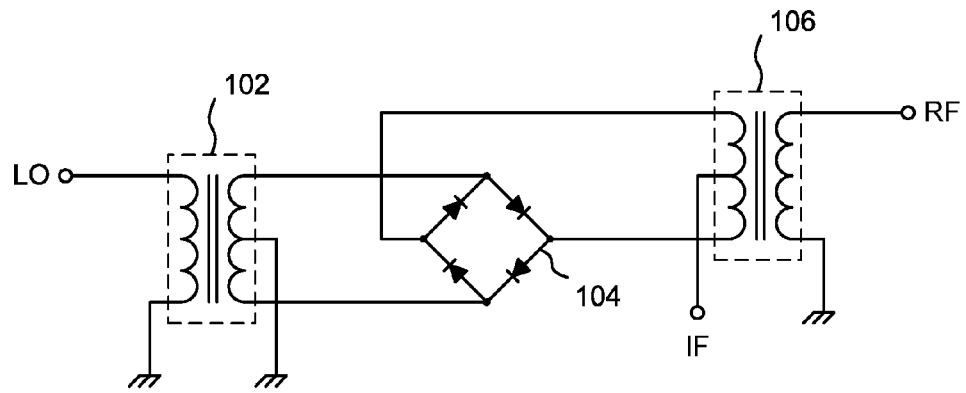
FIG. 1 is a schematic diagram of a conventional diode double balanced mixer.
Figure 2:
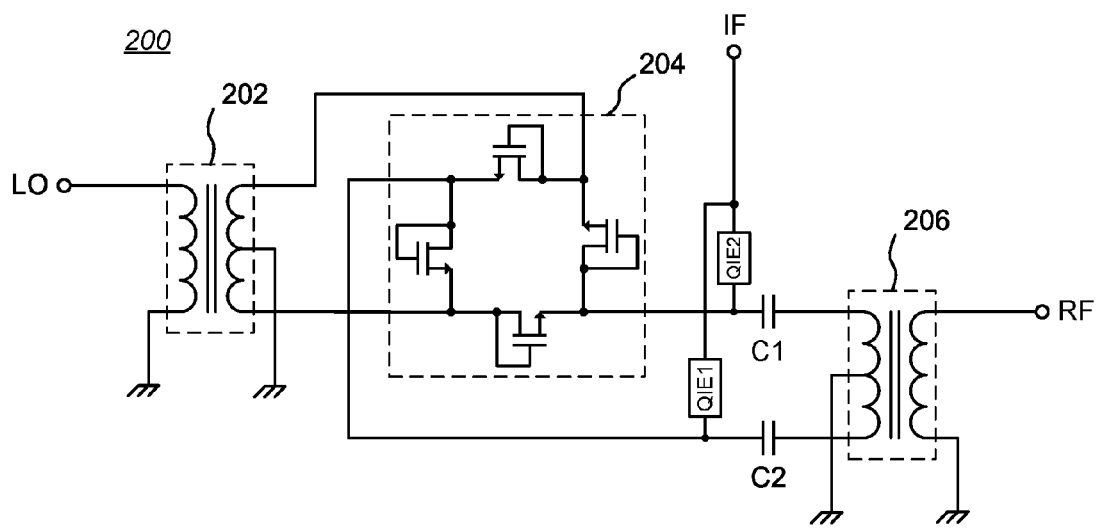
FIG. 2 is a schematic diagram of a first embodiment of a FET-based double balanced mixer in accordance with the present invention.

FIG. 2 is a schematic diagram of a first embodiment of a FET-based double balanced mixer 200 in accordance with the present invention. A first balun 202 is configured to receive a local oscillator (LO) signal on the unbalanced side and generate two balanced LO output signals that are coupled to two corresponding opposing nodes of a four-node FET ring 204. A second balun 206 is configured to pass a radio frequency (RF) signal on the unbalanced side of the second balun 206. The two legs of the balanced side of the second balun 206 are coupled to the remaining two opposing nodes of the FET ring 204 through DC-blocking capacitors C1, C2 which provide isolation between the RF and intermediate frequency (IF) signal ports. The first balun 202 and the second balun 206 may be external transformers, but are preferably integrally fabricated with the other circuitry on an IC, in known fashion.

In the illustrated embodiment, the IF signal port is coupled through quarter-wave isolation elements QIE1, QIE2 to the same two nodes of the FET ring 204 to which the second balun 206 is connected. The quarter-wave isolation elements QIE1, QIE2 provide isolation between the RF and IF signals, and are preferably implemented as microstrip transmission lines, but in some applications may be implemented as stripline transmission lines, co-planar waveguides, or equivalent structures or circuits. Taking the IF signal at those points has the advantage of improved balance because the first balun 202 and the second balun 206 can be essentially identical. The quarter-wave isolation elements QIE1, QIE2 will phase-shift the signals from the two nodes of the FET ring 204 such that they are in-phase at the IF port, resulting in twice the output signal strength compared to one of the out-of-phase IF signals of conventional DBMs. Notably, because of the quarter-wave isolation elements QIE1, QIE2, no balun is required for the IF port, as is the case with some conventional DBM circuits. Elimination of an IF balun also improves conversion gain. In alternative embodiments, the quarter-wave isolation elements QIE1, QIE2 can be replaced by equivalent circuits, such as inductive elements and lumped element circuit components. However, quarter-wave transmission lines generally will generally provide greater bandwidth.

The FET ring 204 includes at least four FETs connected as branches of a ring, with the nominal source of each FET (indicated by an arrow in FIG. 2) connected to the nominal drain of a next FET in the ring. Technically, as would be understood by one of ordinary skill in the art, the nominal source and drain of the FETs swap function each half cycle of the LO drive signal. When the LO signal is positive, then the functional drain is as shown in FIG. 2, and the FET is ON (conductive). When the LO signal is negative, then the nominal source and drain swap function and negative voltage is applied to the FET gate from the nominal drain (now functionally the source), which keeps the FET OFF (non-conductive, blocking).

The FETs are preferably fabricated as enhancement mode devices using NMOS or CMOS technology, but the circuit may be adapted to other FET modes and technologies. Notably, fabrication in thin film, partially depleted, or fully depleted CMOS technology on silicon-on-insulator (SOI) or silicon-on-sapphire (SOS) substrates enables further improvements in linearity, power handling, and isolation.

Each FET is preferably fabricated as, or configured as, a low threshold voltage device. Each FET has its gate connected to its drain, which causes the FET to operate as a diode, but with the unique characteristic of having close to a zero turn-on voltage (within about ±0.1V); that is, the turn-on voltage of the drain-gate connected FET is approximately equal to the threshold voltage of the FET.

Figure 3:
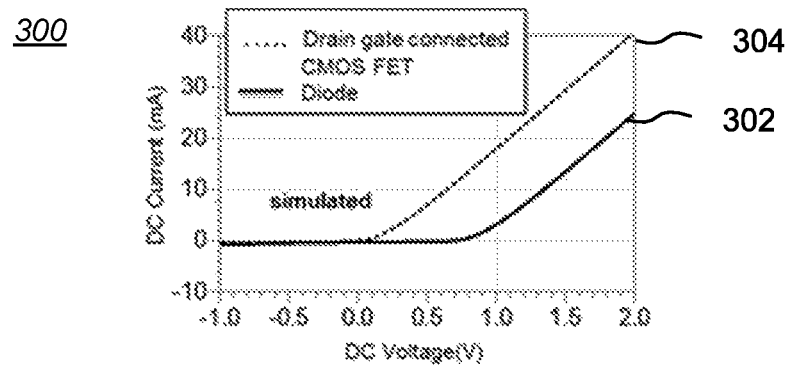
FIG. 3 is a graph showing DC current as a function of DC voltage for a simulated conventional diode and a simulated drain-gate connected FET.

FIG. 3 is a graph 300 showing DC current as a function of DC voltage for a simulated conventional diode (graph line 302) and a simulated drain-gate connected FET (graph line 304). The simulated conventional diode does not begin to conduct any significant current until the turn-on voltage reaches about 0.7V, whereas the simulated drain-gate connected FET begins to conduct significant current when the turn-on voltage is just slightly above about 0.0V.

For FETs, the following saturation condition applies: $V_{DS} \geq V_{GS} - V_T$. However, since the gate and drain of each FET in the FET ring 204 are shorted, then $V_{GS} = V_{DS}$. This means that once $V_{DS} > V_T$, the FET both begins to conduct and enters saturation (technically, the FET rapidly passes through a very narrow region when it is in the linear mode before passing into saturation). Normally, this characteristic is undesirable, since conduction in the FET diode could not be readily turned off. However, it was recognized by the inventor that this FET diode characteristic allows mixing operation at very low LO power levels, whereas a traditional DBM requires significant LO power levels to turn the diode ring ON and OFF.

Another advantage of using drain-gate connected FETs in a DBM is that FETs have fewer parasitic characteristics (e.g., parasitic capacitances) than conventional diodes, which improves bandwidth performance.

Figure 4:
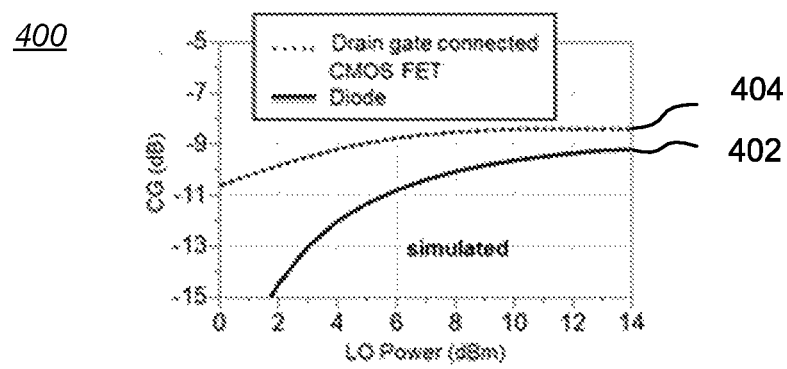
FIG. 4. is a graph showing conversion gain CG as a function of LO power for a simulated conventional diode DBM and a simulated drain-gate connected FET-based DBM.

Using drain-gate connected low threshold voltage FETs in a FET ring 204 for a DBM reduces conversion gain variation versus LO power. For example, FIG. 4. is a graph 400 showing conversion gain CG as a function of LO power for a simulated conventional diode DBM (graph line 402) and a simulated drain-gate connected low threshold voltage FET-based DBM (graph line 404). As can be seen, CG rapidly decreases as LO power decreases for the conventional diode DBM, due to the turn-on voltage (approximately 0.7V in this simulation) of the diodes, whereas the CG is fairly linear (and quite linear from about 6-14 dBm) for the drain-gate connected low threshold voltage FET-based DBM. As a person of ordinary skill in the art will understand, improved linearity at lower LO power levels is a key figure of merit for frequency mixers.

Figure 5:
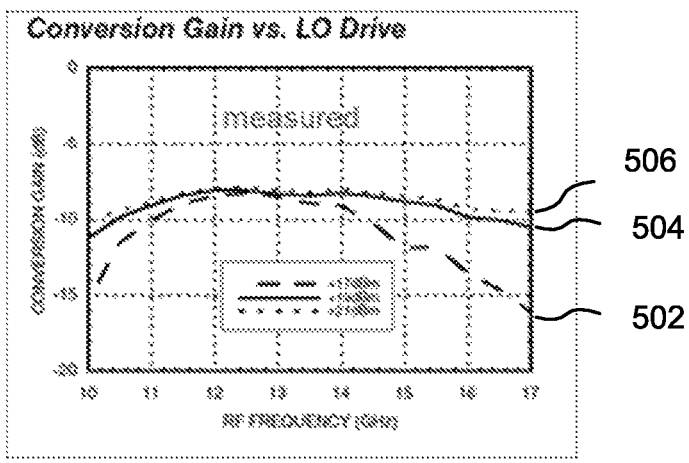
FIG. 5 is a graph showing measured conversion gain CG as a function of frequency for a conventional diode DBM using three different LO power levels (17, 19, and 21 dBm).

Actual measurements confirm the reduced conversion gain variation versus LO power of the present invention, as well as wide-band linearity over a range of LO power levels. FIG. 5 is a graph 500 showing measured conversion gain CG as a function of frequency for a conventional diode DBM using three different LO power levels (dashed curve 502 is at 17 dBm, solid curve 504 is at 19 dBm, and dotted curve 506 is at 21 dBm). As can be seen, at the lowest LO power level, 17 dBm, the CG for the conventional diode DBM severely rolls off at both low frequencies (below about 12 GHz) and at high frequencies (above about 14 GHz), showing about a 7 dB variation over a 7 GHz span of frequencies. Only by boosting the LO power to much higher levels (e.g., 19 dBm or 21 dBm) does the conventional diode DBM exhibit reasonable linearity. As between LO power levels, the CG variation is about 4 dB over a 4 dB variation in LO power level.

Figure 6:
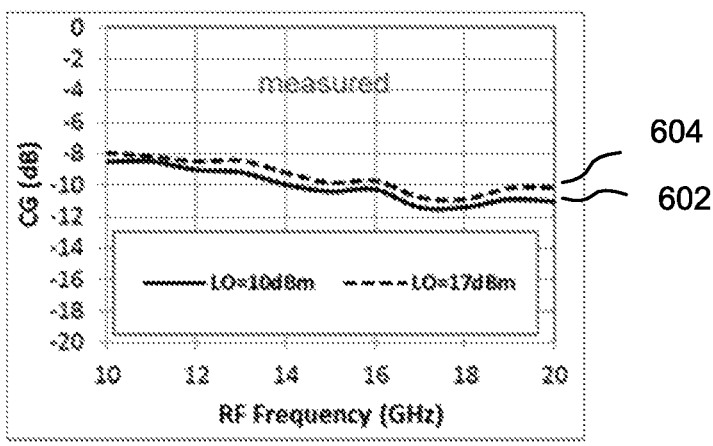
FIG. 6 is a graph showing measured conversion gain CG as a function of frequency for a drain-gate connected FET-based DBM using two different LO power levels (10 and 17 dBm).

FIG. 6 is a graph 600 showing measured conversion gain CG as a function of frequency for a drain-gate connected FET-based DBM using two different LO power levels (10 and 17 dBm). As can be seen, the CG variation is only about 4 dB for an LO power level of 10 dBm (solid curve 602), and only about 3 dB for an LO power level of 17 dBm (dashed curve 604), over a 10 GHz frequency span. Further, as between LO power levels, the CG variation is only about 0.7 dB over a 7 dB variation in LO power level. Accordingly, a drain-gate connected FET-based DBM in accordance with the present invention provides better CG (i.e., less loss), better linearity, and wider bandwidth than a conventional diode DBM.

Second Embodiment

Figure 7:
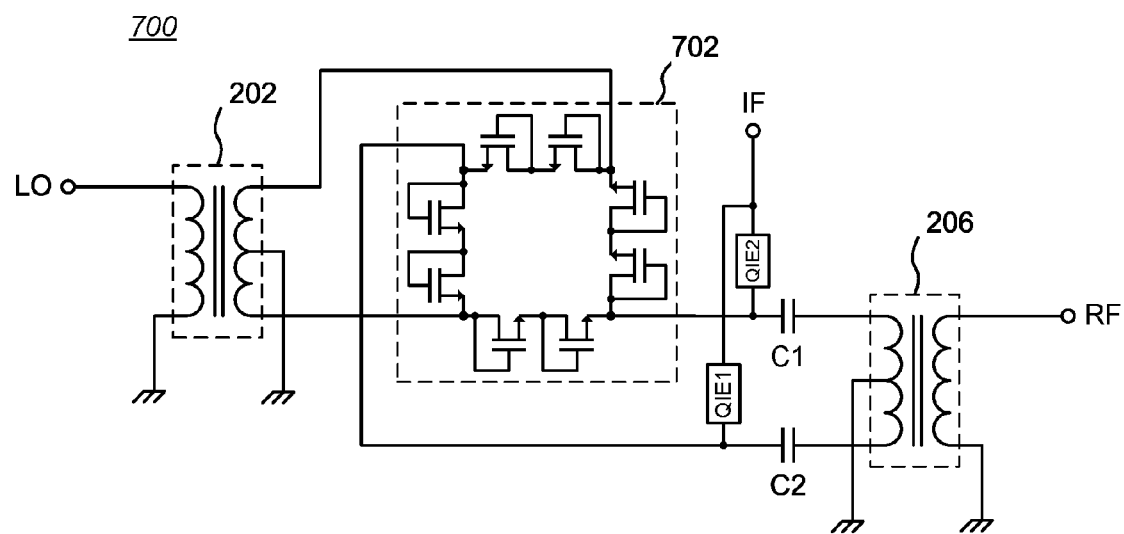
FIG. 7 is a schematic diagram of a second embodiment of a FET-based double balanced mixer in accordance with the present invention, having two drain-gate connected FETs per branch of a four-node FET ring.

The linearity of a drain-gate connected FET-based DBM can be improved even further by using more than one drain-gate connected FET per branch of the four-node FET ring 204. For example, FIG. 7 is a schematic diagram of a second embodiment of a FET-based double balanced mixer 700 in accordance with the present invention, having two drain-gate connected FETs per branch of a four-node FET ring 702. More specifically, the FET ring 702 comprises four branches connected as a ring, with each branch including two drain-gate connected FETs (preferably low threshold voltage FETs); the circuitry is otherwise similar to the circuit shown in FIG. 2. The source of each drain-gate connected FET (indicated by an arrow in FIG. 7) is connected to the drain of a next drain-gate connected FET in the ring; the nodes of the FET ring 702 are between branches containing adjacent sets (pairs, in the illustrated configuration) of drain-gate connected FETs. While FIG. 7 shows two drain-gate connected FETs per branch of a four-node FET ring 204, the concept may be extended for some applications by including more than two drain-gate connected FETs per branch of a four-node FET ring 204. As with FIG. 2, the drain-gate connected FETs are preferably fabricated as enhancement mode devices using NMOS or CMOS technology, but the circuit may be adapted to other FET modes and technologies.

Figure 8:
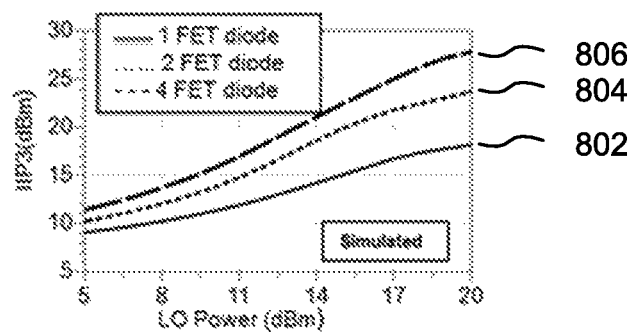
FIG. 8 is a graph of third-order input-referenced intercept point (IIP3) values as a function of LO power for simulated drain-gate connected FET DBMs having different numbers of drain-gate connected FETs per branch of a four-node FET ring.

The multi-FET diode per branch topology shown in FIG. 7 has the advantage of improved linearity. FIG. 8 is a graph 800 of third-order input-referenced intercept point (IIP3) values as a function of LO power for simulated drain-gate connected FET DBMs having different numbers of drain-gate connected FETs per branch of a four-node FET ring 204. Solid curve 802 represents a DBM having one drain-gate connected FET diode per branch; dotted curve 804 represents a DBM having two drain-gate connected FET diodes per branch; and dashed curve 806 represents a DBM having four drain-gate connected FET diode per branch. As can be seen, additional drain-gate connected FET diodes per FET ring branch rapidly improves IIP3 as a function of LO power.

FIG. 8 also shows that linearity is improving rapidly with increasing LO power (i.e., about 1 dB per dBm of LO power). One of the key advantages of a multiple-FET per branch architecture is that it should be able to drive to much higher LO powers since the LO voltage is being divided amongst more series FETs (2 or 4 in this case) per branch. For example, such an architecture should be able to get to about 6 dB more LO power (2× voltage) with two FETs per branch compared to one FET per branch, thereby getting to potentially higher IIP3 values.

Figure 9:
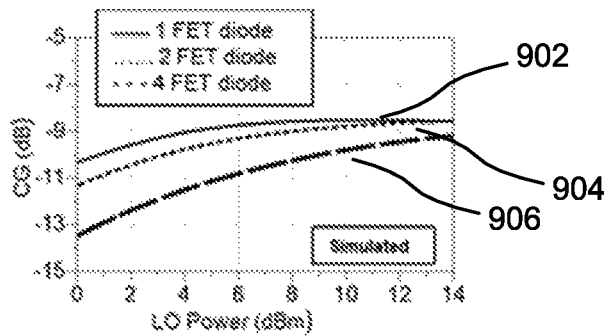
FIG. 9 is a graph of conversion gain CG as a function of LO power for simulated drain-gate connected FET DBMs having different numbers of drain-gate connected FETs per branch of a four-node FET ring.

Conversely, adding drain-gate connected FET diodes per FET ring branch does not have a large effect on conversion gain variation versus LO power. For example, FIG. 9 is a graph 900 of conversion gain CG as a function of LO power for simulated drain-gate connected FET DBMs having different numbers of drain-gate connected FETs per branch of a four-node FET ring 204. Solid curve 902 represents a DBM having one drain-gate connected FET diode per branch; dotted curve 904 represents a DBM having two drain-gate connected FET diodes per branch; and dashed curve 906 represents a DBM having four drain-gate connected FET diode per branch. Even with four drain-gate connected FET diodes per FET ring branch, CG varies less than about 4 dB over a 14 dB variation in LO power level (although a large amount of LO power is not required for embodiments of the invention).

Methods

Another aspect of the invention includes a method for fabricating a double balanced mixer having a first balun having an unbalanced side configured to pass a local oscillator (LO) signal and a pair of ports on a balanced side and having a second balun having an unbalanced side configured to pass a radio frequency (RF) signal and a pair of ports on a balanced side, including: providing a four-node field effect transistor (FET) ring including four branches, each branch including at least one FET, wherein the source of each FET is connected to the drain of a next FET in the four-node FET ring and each FET has a gate and a drain connected together as a diode having close to a zero turn-on voltage, wherein a first pair of opposing nodes of the four-node FET ring are connected to the pair of ports on the balanced side of the first balun, and a second pair of opposing nodes of the four-node FET ring are connected through corresponding capacitors to the pair of ports on the balanced side of the second balun; and providing an intermediate frequency (IF) signal port coupled through corresponding quarter-wave isolation elements to the second pair of opposing nodes of the four-node FET ring.

Still another aspect of the invention includes a method for fabricating a double balanced mixer, including: providing a four-node field effect transistor (FET) ring including four branches, each branch including at least one FET having a source, a drain, and a gate; configuring the source of each FET to be connected to the drain of a next FET in the four-node FET ring; configuring each FET as a diode having close to a zero turn-on voltage by connecting the drain of such FET to the gate of such FET; providing a first balun having an unbalanced side configured to pass a local oscillator (LO) signal and a pair of ports on a balanced side coupled to a corresponding pair of first opposing nodes of the four-node FET ring; providing a second balun having an unbalanced side configured to pass a radio frequency (RF) signal and a pair of ports on a balanced side coupled through corresponding capacitors to a corresponding pair of second opposing nodes of the four-node FET ring; and providing an intermediate frequency (IF) signal port coupled through corresponding quarter-wave isolation elements to the second opposing nodes of the four-node FET ring.

Other aspects of the above methods include: wherein the FETs are low threshold voltage FETs; wherein the quarter-wave isolation elements are quarter-wave transmission lines; wherein the four-node FET ring includes at least two FETs per branch; wherein the four-node FET ring includes at least four FETs per branch; fabricating the double balanced mixer as an integrated circuit; fabricating the integrated circuit on a silicon-on-insulator (SOI) or a silicon-on-sapphire (SOS) substrate; and fabricating the integrated circuit using one of thin film, partially depleted, or fully depleted CMOS technology.

Fabrication Technologies and Options

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, higher port-to-port isolation, and high frequency operation (in excess of about 10 GHz, and particularly above about 20 GHz). Further, as noted above, fabrication in thin film, partially depleted, or fully depleted CMOS on SOI or SOS enables further improvements in linearity, power handling, and isolation. Monolithic IC implementation is particularly useful since parasitic capacitances generally can be kept low (or at a minimum, kept uniform across all units, permitting them to be compensated) by careful design.

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

Voltage and current levels may be adjusted, and voltage, current, and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

What is claimed is:

1. A double balanced mixer having a first balun having an unbalanced side configured to pass a local oscillator (LO) signal and a pair of ports on a balanced side and having a second balun having an unbalanced side configured to pass a radio frequency (RF) signal and a pair of ports on a balanced side, the double balanced mixer including:

(a) a four-node ring including four branches, each branch including at least one field effect transistor (FET), each FET having a source, a drain, and a gate, wherein the source of each FET is connected to the drain of a next FET in the four-node FET ring and the gate and the drain of each FET are connected together as a diode, wherein a first pair of opposing nodes of the four-node FET ring are connected to the pair of ports on the balanced side of the first balun, and a second pair of opposing nodes of the four-node FET ring are connected through corresponding capacitors to the pair of ports on the balanced side of the second balun; and (b) an intermediate frequency (IF) signal port coupled through corresponding quarter-wave isolation elements to the second pair of opposing nodes of the four-node FET ring.

2. The invention of claim 1, wherein the FETs are low threshold voltage FETs.

3. The invention of claim 1, wherein the quarter-wave isolation elements are quarter-wave transmission lines.

4. The invention of claim 1, wherein the four-node FET ring includes at least two FETs per branch.

5. The invention of claim 1, wherein the four-node FET ring includes at least four FETs per branch.

6. The invention of claim 1, wherein the double balanced mixer is fabricated as an integrated circuit.

7. The invention of claim 6, wherein the integrated circuit is fabricated on a silicon-on-insulator (SOI) or a silicon-on-sapphire (SOS) substrate.

8. The invention of claim 7, wherein the integrated circuit is fabricated using one of thin film, partially depleted, or fully depleted CMOS technology.

9. A double balanced mixer, including:

(a) a four-node field effect transistor (FET) ring including four branches, each branch including at least one FET having a source, a drain, and a gate, wherein the source of each FET is connected to the drain of a next FET in the four-node FET ring and the gate and the drain of each FET are connected together as a diode having close to a zero turn-on voltage;

(b) a first balun having an unbalanced side configured to pass a local oscillator (LO) signal and a pair of ports on a balanced side coupled to a corresponding pair of first opposing nodes of the four-node FET ring;

(c) a second balun having an unbalanced side configured to pass a radio frequency (RF) signal and a pair of ports on a balanced side coupled through corresponding capacitors to a corresponding pair of second opposing nodes of the four-node FET ring; and (d) an intermediate frequency (IF) signal port coupled through corresponding quarter-wave isolation elements to the second opposing nodes of the four-node FET ring.

10. The invention of claim 9, wherein the FETs are low threshold voltage FETs.

11. The invention of claim 9, wherein the quarter-wave isolation elements are quarter-wave transmission lines.

12. The invention of claim 9, wherein the four-node FET ring includes at least two FETs per branch.

13. The invention of claim 9, wherein the four-node FET ring includes at least four FETs per branch.

14. The invention of claim 9, wherein the double balanced mixer is fabricated as an integrated circuit.

15. The invention of claim 14, wherein the integrated circuit is fabricated on a silicon-on-insulator (SOI) or a silicon-on-sapphire (SOS) substrate.

16. The invention of claim 15, wherein the integrated circuit is fabricated using one of thin film, partially depleted, or fully depleted CMOS technology.

17. A method for fabricating a double balanced mixer having a first balun having an unbalanced side configured to pass a local oscillator (LO) signal and a pair of ports on a balanced side and having a second balun having an unbalanced side configured to pass a radio frequency (RF) signal and a pair of ports on a balanced side, including:

(a) providing a four-node field effect transistor (FET) ring including four branches, each branch including at least one FET, wherein the source of each FET is connected to the drain of a next FET in the four-node FET ring and each FET has a gate and a drain connected together as a diode having close to a zero turn-on voltage, wherein a first pair of opposing nodes of the four-node FET ring are connected to the pair of ports on the balanced side of the first balun, and a second pair of opposing nodes of the four-node FET ring are connected through corresponding capacitors to the pair of ports on the balanced side of the second balun; and (b) providing an intermediate frequency (IF) signal port coupled through corresponding quarter-wave isolation elements to the second pair of opposing nodes of the four-node FET ring.

18. The method of claim 17, wherein the FETs are low threshold voltage FETs.

19. The method of claim 17, wherein the quarter-wave isolation elements are quarter-wave transmission lines.

20. The invention of claim 17, wherein the four-node FET ring includes at least two FETs per branch.

21. The invention of claim 17, wherein the four-node FET ring includes at least four FETs per branch.

22. The method of claim 17, further including fabricating the double balanced mixer as an integrated circuit.

23. The method of claim 22, further including fabricating the integrated circuit on a silicon-on-insulator (SOI) or a silicon-on-sapphire (SOS) substrate.

24. The method of claim 23, further including fabricating the integrated circuit using one of thin film, partially depleted, or fully depleted CMOS technology.

25. A method for fabricating a double balanced mixer, including:

(a) providing a four-node field effect transistor (FET) ring including four branches, each branch including at least one FET having a source, a drain, and a gate;

(b) configuring the source of each FET to be connected to the drain of a next FET in the four-node FET ring;

(c) configuring each FET as a diode having close to a zero turn-on voltage by connecting the drain of such FET to the gate of such FET;

(d) providing a first balun having an unbalanced side configured to pass a local oscillator (LO) signal and a pair of ports on a balanced side coupled to a corresponding pair of first opposing nodes of the four-node FET ring;

(e) providing a second balun having an unbalanced side configured to pass a radio frequency (RF) signal and a pair of ports on a balanced side coupled through corresponding capacitors to a corresponding pair of second opposing nodes of the four-node FET ring; and (f) providing an intermediate frequency (IF) signal port coupled through corresponding quarter-wave isolation elements to the second opposing nodes of the four-node FET ring.

26. The method of claim 25, wherein the FETs are low threshold voltage FETs.

27. The method of claim 25, wherein the quarter-wave isolation elements are quarter-wave transmission lines.

28. The method of claim 25, wherein the four-node FET ring includes at least two FETs per branch.

29. The method of claim 25, wherein the four-node FET ring includes at least four FETs per branch.

30. The method of claim 25, further including fabricating the double balanced mixer as an integrated circuit.

31. The method of claim 30, further including fabricating the integrated circuit on a silicon-on-insulator (SOI) or a silicon-on-sapphire (SOS) substrate.

32. The method of claim 31, further including fabricating the integrated circuit using one of thin film, partially depleted, or fully depleted CMOS technology.

\* \* \* \* \*